United States Patent [19]
Thoulon et al.

[11] Patent Number: 5,621,883
[45] Date of Patent: Apr. 15, 1997

[54] CIRCUIT FOR TESTING MICROPROCESSOR MEMORIES

[75] Inventors: Pierre-Yves Thoulon, Voreppe; Pierre Sauvage, Vif, both of France

[73] Assignee: Hewlett-Packard Company, Palo Alto, Calif.

[21] Appl. No.: 613,597

[22] Filed: Mar. 11, 1996

Related U.S. Application Data

[63] Continuation of Ser. No. 143,782, Nov. 1, 1993, abandoned.

[30] Foreign Application Priority Data

Oct. 30, 1992 [FR] France ................................. 92 13430

[51] Int. Cl.$^6$ ........................... G06F 11/00; G11C 29/00
[52] U.S. Cl. .................... 395/182.07; 395/183.18; 371/21.2; 371/27; 364/265.3
[58] Field of Search ............................. 395/575, 182.07, 395/183.18, 183.16, 183.07; 371/21.1, 21.2, 67.1, 68.1, 68.2, 27, 24, 25.1; 364/242.3, 242.31, 242.34, 970.1, 245.3, 265.3; 365/201, 202

[56] References Cited

U.S. PATENT DOCUMENTS

| | | | |
|---|---|---|---|
| 4,715,034 | 12/1987 | Jacobson | 371/21.2 |
| 4,873,705 | 10/1989 | Johnson | 371/21.2 |
| 5,109,382 | 4/1992 | Fukunaka | 371/21.1 |
| 5,157,664 | 10/1992 | Waite | 371/10.2 |
| 5,423,029 | 6/1995 | Schieve | 395/182.07 |

FOREIGN PATENT DOCUMENTS

| | | |
|---|---|---|
| 0365114 | 4/1990 | European Pat. Off. . |
| 0470030 | 2/1992 | European Pat. Off. . |

OTHER PUBLICATIONS

R. Nair et al., Efficient Algorithms for Testing Semiconductor Random–Access Memories, *IEEE Transactions on Computer*, vol. C–27, No. 6, Jun. 1978, pp. 572–576.

*Primary Examiner*—Robert W. Beausoliel, Jr.
*Assistant Examiner*—Trinh L. Tu

[57] ABSTRACT

A Direct Memory Access (DMA) controller incorporates a memory test circuit that executes, using a dedicated system, repetitive memory read and write test phases such as are executed in conventional memory test methods by programs.

16 Claims, 4 Drawing Sheets

CIRCUIT FOR TESTING MICROPROCESSOR MEMORIES

This application is a continuation of application Ser. No. 08/143,782 filed Nov. 1, 1993, abandoned.

BACKGROUND OF THE INVENTION

1. Field of the Invention

The present invention relates to circuits for testing a memory, in particular a Random-Access Memory (RAM) in a microprocessor system.

2. Discussion of the Related Art

For testing a memory, there are several methods for detecting different types of abnormal situations, such as memory cells stuck at a determined value, shorted or open address or data lines, etc. By testing a memory using several methods and by adequately analyzing the results, an exhaustive memory test can be performed, thus allowing localisation of all abnormal situations. Test methods are described in IEEE Transactions on Computers, Vol. C-27, No. 6, June 1978, "Efficient Algorithms for Testing Semiconductor Random-Access Memories". In this document, various works on test methods are referred to.

Figure 1:
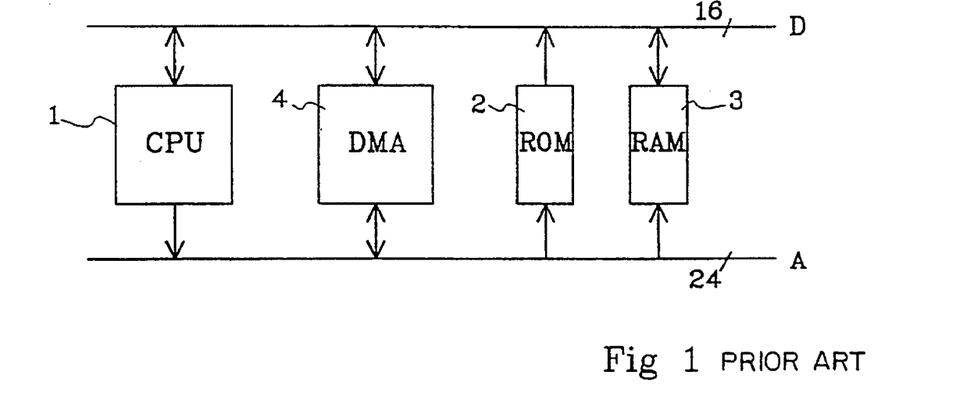
FIG. 1, described above, schematically and partially represents a conventional microprocessor system.

FIG. 1 schematically represents a conventional microprocessor system. Such system includes a Central Processing Unit (CPU) 1, a Read-Only Memory (ROM) 2, a Random-Access Memory (RAM) 3, and a Direct Memory Access (DMA) controller 4, that are connected to a microprocessor bus comprised, for example, of a 16-line data bus D, and a 24-line address bus A.

Conventionally, in order to test the RAM 3, microprocessor 1 executes a test program whose instructions are stored in ROM 2. This test program is executed, for example, at power on of the system, or at regular time intervals.

When testing the RAM 3, microprocessor 1 generally executes, for each cell of the RAM to be tested, at least one write and one read in the RAM together with several instruction reads from ROM. During a memory test, a large number of accesses are made to ROM, which causes the test to be substantially slowed down because accesses in ROM are particularly time consuming.

In practice, an exhaustive test of a 2-megabyte RAM, which is a common value, lasts for approximately four hours; during this period, the microprocessor cannot be used to perform other tasks. Hence, such a test is executed as seldom as possible.

Additionally, a program that executes an exhaustive memory test occupies approximately 20 kilobytes, which is a substantial value involving non-negligible extra cost in mass produced microprocessor systems.

In order to accelerate test programs, one could envisage storing the instructions of the test program in a battery backed-up RAM. However, such an approach is expensive and much time would still be spent on the numerous instruction reads.

It would also be possible to test memories without resorting to a test program but by using a hard wired system in the form of a specific test circuit connected to the microprocessor bus. However, it is not desirable to provide an additional integrated test circuit that has to be inserted on a microprocessor board, because such a solution would involve extra costs for mounting and designing microprocessor boards.

SUMMARY OF THE INVENTION

An object of the present invention is to provide a particularly fast circuit for testing memory.

Another object of the invention is to provide a circuit for testing memory, that is incorporated in an integrated circuit existing on conventional microprocessor boards.

A further object of the invention is to provide such a test circuit having a control program that occupies little memory space.

These objects are achieved by incorporating the test circuit in the DMA controller of the microprocessor system. The applicant has noticed that DMA controllers have proven to be particularly appropriate for incorporating memory test functions, since such DMA controllers are already designed to directly access a memory.

The invention more particularly relates to a DMA controller incorporating a memory test circuit that executes, using dedicated circuitry, repetitive memory read and write test phases which are executed in conventional memory test methods.

According to an embodiment of the invention, the DMA controller includes an interface circuit that can be enabled to read or write data on a microprocessor bus, and first to fourth registers that are accessible through the bus and the DMA controller. The first and second registers are incrementable and/or decrementable by a sequencer of the DMA controller and are intended to contain addresses of the memory cells where the interface circuit is to read or write. According to the invention, the memory test circuit includes a first comparator providing a cell-good signal, that is asserted when a test datum, corresponding if required to the content of the third register, is equal to a datum read by the interface circuit at a specific address contained in one of the first and second registers. A second comparator provides a phase-end signal, that is asserted when the contents of the first and second registers are equal. A sequencer is provided for successively incrementing or decrementing the specific address, for suspending the incrementating or decrementating when the phase-end signal is asserted, and for indicating the end of the phase by modification of one bit of the fourth register. At each incrementating or decrementating, the sequencer either writes the test datum to the specific address or reads a datum from this address, the sequencer setting an error bit of the fourth register if the cell-good signal is not set following an operation.

According to an embodiment of the invention, the DMA controller includes selection means for providing to the interface circuit and to the first comparator a test datum which, depending on the value of a first plurality of bits of the fourth register, corresponds either to the contents of the third register, or to one or other predetermined portions of the specific address.

According to an embodiment of the invention, the selection means include an inverter for complementing the test datum when enabled by an inversion signal that is provided by the sequencer.

According to an embodiment of the invention, the sequencer is controlled by a second plurality of bits of the fourth register such that, in dependence on the value defined by these bits, one of the following operations is carried out in respect of the cell pointed to by the specific address: writing the test datum; reading and comparing the read datum with the test datum; reading, comparing and writing the complement of the test datum; or twice reading, comparing and writing the complement.

According to an embodiment of the invention, one bit of the fourth register has a state that enables the test circuit, and a second state that disables the test circuit while allowing the DMA controller to conventionally operate.

According to an embodiment of the invention, one bit of the fourth register is set by the microprocessor to start or to continue a test phase, and reset by the test circuit to interrupt the microprocessor at the end of the test phase or when the error bit is set.

According to an embodiment of the invention, the state of one bit of the fourth register determines whether the first register is incremented or whether the second register is decremented by the sequencer.

An advantage of the invention is that the DMA controller on existing microprocessor boards can be replaced with a DMA controller incorporating a test circuit according to the invention in order to provide these boards with a more rapid test capability.

The foregoing and other objects, features, aspects and advantages of the invention will become apparent from the following detailed description of the present invention when taken in conjunction with the accompanying drawings.

DETAILED DESCRIPTION

As mentioned above, the invention proposes incorporating memory test functionalities in a DMA controller.

It is useful to describe some of the elements of a conventional DMA controller, that are also used in a test circuit according to the invention.

A DMA controller includes at least four registers that are accessible by the microprocessor bus. Two of the registers are conventionally designed to respectively contain a start (or origin) address of a memory block to be transferred and a block destination address (such registers have a 24-bit size in the example of FIG. 1). Additionally, these two registers are configured as up/down counters. A third register conventionally serves to store the length of the block to be transferred (in the example of FIG. 1, this register is a 24-bit register). The fourth register is a control register allowing the microprocessor to set various parameters and to collect status information. The DMA controller also includes a bus interface circuit, which enables it to take control of the bus independently of the microprocessor. More detailed information on DMA controllers can be found in numerous user's manuals available on the market.

The above-mentioned registers, especially the registers intended to contain the origin and destination addresses, occupy the major part of the surface of the DMA controller chip.

According to the invention, these registers are also advantageously used for a test circuit, but for different functions that are described hereinafter. The adaptation of such registers requires only the addition of a few bits in the above-mentioned control register. The size of the elements to be added to the test circuit is small as compared with the size of the registers.

Figure 2:
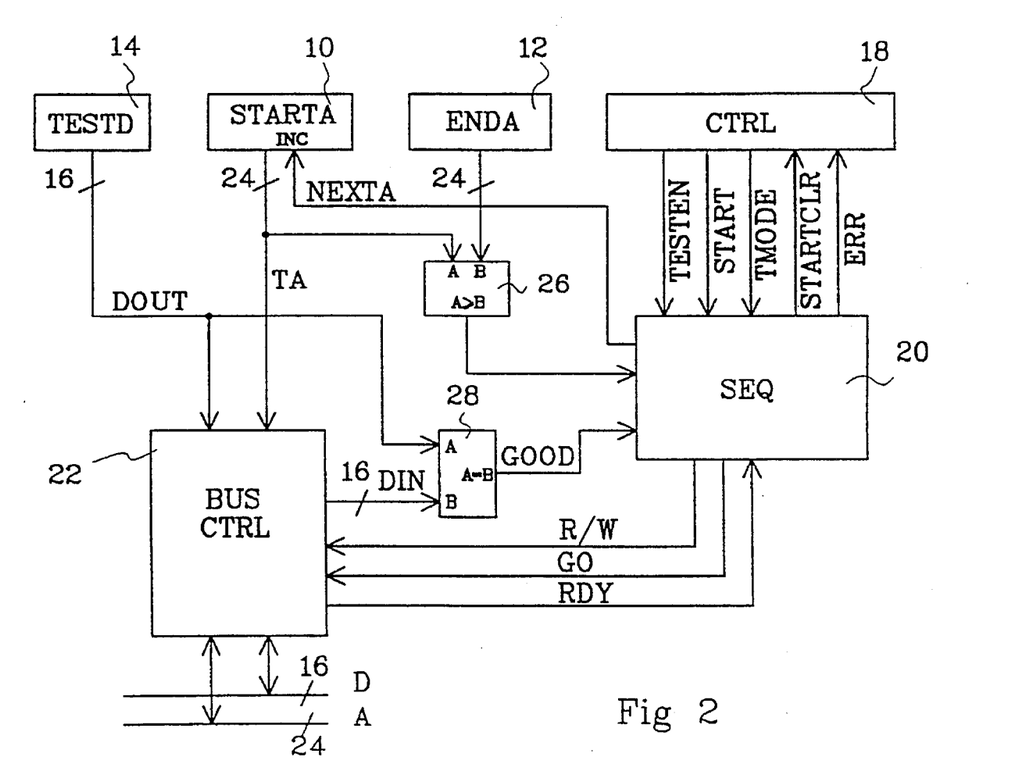
FIG. 2 schematically represents an embodiment of an architecture of a circuit for testing microprocessor memories, according to the invention, incorporated in a DMA controller.

FIG. 2 schematically represents an architecture of a simplified embodiment of a test circuit according to the invention, incorporated in a DMA controller. This circuit is referred to hereinafter as "DMA/test circuit". The above four registers are referenced 10, 12, 14, and 18, respectively.

The first register, 10, of the up/down counting registers of the DMA controller, is used to store a start address, STARTA, of the memory block to be tested.

The second up/down counting register, 12, is used to store an end address, ENDA, of the memory block to be tested.

The third register, 14, that conventionally serves to store the length of a memory block to be transferred, is used according to the invention to store one test datum, TESTD. (In the given exemplary 24-line address bus and 16-line data bus, register 14 must, for the DMA controller, have a 24-bit size; this size is therefore sufficient to contain a 16-bit datum).

The fourth register 18 is the control register of the DMA controller, and is also used according to the invention as a control register, but its bits have different significations during the use of the DMA/test circuit depending on whether it is operating as a DMA controller or as a memory tester. As usual, registers 10, 12, 14, and 18 are accessible by the microprocessor bus A/D.

When used as a tester, according to the invention, the control register 18 of the circuit includes at least the following bits:

one bit TESTEN for disabling the DMA functions and enabling the test functions of the DMA/test circuit;

one bit START for initializing a memory test phase;

one or several bit(s) TMODE for selecting a test phase amongst two, or more, specific phases; and an error bit ERR allowing the DMA/test circuit to signal to the microprocessor that an error condition has been detected.

All these bits, except one, the bit TESTEN, are bits already existing in a conventional DMA controller. Thus, to fabricate a DMA/test circuit, it is merely necessary to add at least bit TESTEN to the control register.

The states of bits TESTEN, START and TMODE are provided to a sequencer 20. Sequencer 20 is connected to register 18 through a line ERR for setting bit ERR and through a line STARTCLR for resetting bit START.

A circuit 22 serves as an interface circuit between the test circuit and the external bus A/D. The interface circuit 22 receives on lines DOUT the test datum TESTD contained in register 14, and on lines TA the address STARTA contained in register 10. Circuit 22 receives from sequencer 20 a read or write enable signal R/W, and a signal GO for taking control of bus A/D. Additionally, circuit 22 provides on lines DIN a datum that is read on bus A/D and provides to sequencer 20 a signal RDY for signalling that the read or write operation initialized by signal GO is completed.

A binary comparator 26 compares address STARTA contained in register 10 with address ENDA contained in register 12, and asserts a line END if addresses STARTA and ENDA are equal. The asserting of line END indicates the end of a test phase to sequencer 20. Line END is also asserted if address STARTA is erroneously higher than address ENDA. Sequencer 20 provides an increment signal NEXTA to register 10 at appropriate times. A binary comparator 28 compares the datum TESTD contained in register 14 with the last datum DIN read by circuit 22 on the bus, and asserts a line GOOD, connected to sequencer 20, when these data are equal.

The interface circuit 22 corresponds to a conventional interface circuit of a DMA controller, to which a few functions have been added, such as the capability of writing on the bus the datum present on lines DOUT (the content of register 14) and of providing on lines DIN the last datum read by the interface circuit on the bus.

In order to test a memory block with the circuit of FIG. 2, a test program executed by the microprocessor schematically operates as follows. The program writes a test datum in register 14, the start address of the block in register 10, and the end address in register 12. The program enables the testing mode by setting bit TESTEN of register 18, selects a test phase by specifying bit(s) TMODE and initializes the phase by setting bit START. The test circuit then executes the test phase by sequentially incrementing (through line NEXTA) address STARTA (register 10) and by acting, at each incrementation, on the memory cell pointed at by address STARTA. The test circuit suspends the test phase and interrupts the microprocessor when bit START is reset, which occurs at the end of the test phase (STARTA=ENDA), or when an error has been detected (bit ERR is then set). If an error is detected, the address contained in register 10 will be pointing at the doubtful cell. The program can then, for example, save (or transfer to another system) the word read from this doubtful cell as well as the cell's address, and re-start the test phase by re-setting bit START.

Thus, the test program executed by the microprocessor merely has to "program" a test phase in the test circuit and to wait for an interrupt. While waiting, the microprocessor can execute other tasks. Sequential accesses to the cells of the block to be tested are effected by the test circuit, which has a much more rapid access to the blocks than a program. Laboratory tests achieved by the applicant have evidenced a gain in time of 80%.

Additionally, the test program executed by the microprocessor includes a limited number of instructions serving only to "program" the test phases and to store, if required, the test results. Such a program occupies only a few hundred bytes in ROM.

Figure 3:
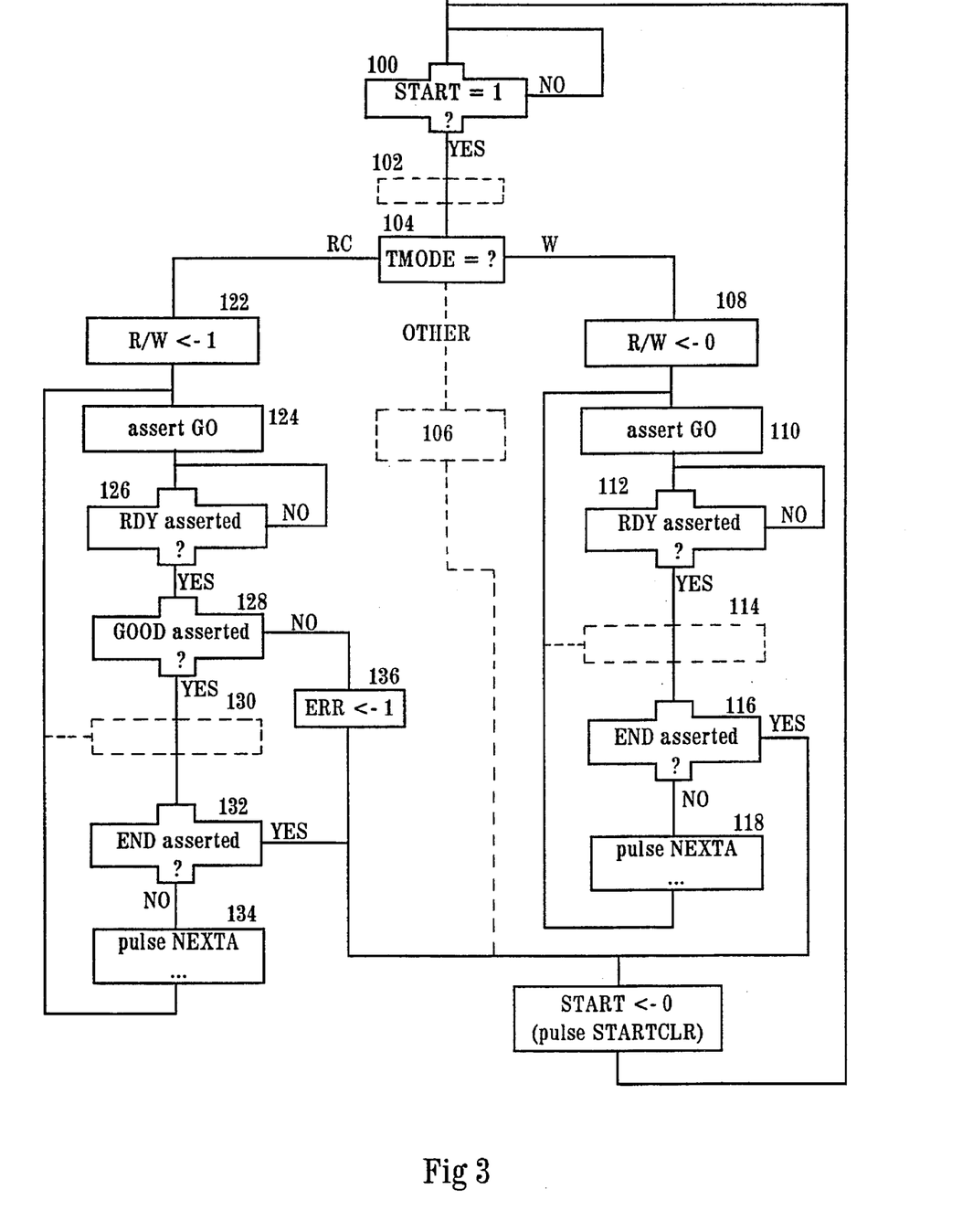
FIG. 3 is a flowchart of operations executed by a sequencer of the circuit of FIG. 2.

FIG. 3 represents a flowchart of the operations executed by sequencer 20 as a function of signals it receives. In the description of the flowchart, a paragraph describing a flowchart block is preceded by the block number. The content of a register is also referred to as "variable".

100. The sequencer remains in a stand-by state as long as bit START is "0". Before the microprocessor sets this bit to "1", it enables, via bit TESTEN, the test mode of the circuit and "programs" the circuit to select a block to be tested (using registers 10 and 12) and a specific test phase (using, in particular, bits TMODE, and also the register 14 if necessary).

102. This block (shown in dotted lines) is used in a more sophisticated embodiment of the test circuit, that will be described hereinafter with reference to FIG. 4.

104. The value of variable TMODE is checked. This variable can have several values, such as:

a value W signalling to the sequencer that a "write" phase is to be executed, consisting of writing the test datum TESTD (register 14) to the memory cells of addresses comprised between address STARTA (register 10) and address ENDA (register 12), or a value RC signalling to the sequencer that a "read-compare" phase is to be executed, consisting of reading data at the addresses comprised between address STARTA and address ENDA, and comparing them with datum TESTD.

In the more sophisticated test circuit of FIG. 4, described later, variable TMODE can have two other values (RCCW, RCCW2) for selecting two additional test phases in a block 106 (drawn in dotted lines). In the example of FIG. 2, variable TMODE is encoded by a single bit of register 18 having a state "0", for example, for defining value RC and a state "1" for defining value W.

108. The "write" mode of the interface circuit 22 is selected by setting line R/W to "0", for example.

110. Sequencer 20 provides a pulse on line GO, causing the interface circuit 22 to take control of the bus and to write on the bus the datum (TESTD) present at its input DOUT.

112. The sequencer waits for a pulse to be provided by interface circuit 22 on line RDY to signal that the interface has executed the required write operation.

114. This block corresponds to operations executed by the more sophisticated test circuit described hereinafter.

116. The sequencer checks the state of line END.

118. Line END is not asserted. The test phase is not finished and datum TESTD has therefore to be written in the next cell of the memory block to be tested. The sequencer provides a pulse on line NEXTA, which increments address STARTA to point to an untested cell. After incrementing address STARTA, the test phase is resumed at block 110 where datum TESTD is written in the untested cell. Dots indicate that additional operations are executed in block 118 by the more sophisticated test circuit of FIG. 4.

120. Line END is asserted, which indicates that address STARTA is equal to address ENDA. The test phase is suspended by the resetting of bit START. (Bit START is reset by the setting of line STARTCLR). The test circuit returns to its stand-by state of block 100.

Resetting bit START generates an interrupt of the microprocessor. The microprocessor processes the interrupt by checking the state of bit ERR and, if required, by storing the useful information contained in the registers of the DMA/test circuit.

122. Variable TMODE is equal to RC. The sequencer selects the "read" mode of the interface circuit 22 by setting line R/W to "1".

124. The sequencer asserts line GO, which indicates to the interface circuit 22 that it must read from memory the datum present at the address (STARTA) provided at its input TA. Once the datum is read, it is latched on the output DIN of the interface circuit.

126. The sequencer waits for line RDY to be asserted, which then indicates that the interface circuit has read the datum and that the latter is present on lines DIN.

128. The sequencer checks the state of line GOOD. Line GOOD is asserted by comparator 28 if data DOUT (test datum) and DIN (datum read from the cell to be tested) are equal.

130. Line GOOD is asserted. No error has been detected in the cell tested at address STARTA. This block, that is identical to block 114, corresponds to operations executed by the more sophisticated test circuit of FIG. 4.

132. As in block 116, a check is made whether the end of the test phase has been reached, that is, if line END is asserted. If yes, the test phase is suspended in block 120 by the resetting of bit START.

134. As in block 118, address STARTA is incremented by the pulsing of line NEXTA; the test phase is resumed at block 124 where the memory cell pointed to by the new address STARTA is read.

136. Line GOOD is not asserted following reading of the datum (DIN) at address STARTA. This means that datum DIN is different from the test datum TESTD. Then, if the block to be tested has previously been filled with datum TESTD, the cell at address STARTA is defective. The error bit ERR is set to "1" and the test phase is suspended at block 120 by the resetting of bit START.

If the test phase is suspended by the detection of a defect, the address (STARTA) of the doubtful cell is available in register 10 and the test datum (TESTD) that was written in this cell is available in register 14. The test program can then store the address STARTA, the word read at address STARTA, and datum TESTD, and then re-start the test phase by setting bit START to "1". The stored results can be subsequently used by conventional software to determine the type of defect.

The circuit of FIG. 2 can advantageously be used for all the known test methods. However, such circuit can be improved, as described hereinafter, to execute test phases, not yet described, that are used in certain methods.

According to some test methods, it is necessary to write different test data in the memory cells to be tested. It may also be necessary to use a test phase, referred to as "read-compare-complement-write" (RCCW), consisting of reading the datum contained in each cell to be tested, comparing the read datum with a test datum, complementing the test datum, and re-writing the complemented test datum in the cell. Another conventional test phase, referred to as "twice read-compare-complement-write" (RCCW2), consists of repeating twice the preceding phase. Such operations can be executed by the circuit of FIG. 2, with a test program that is more time consuming but still advantageous over the prior art.

Figure 4:
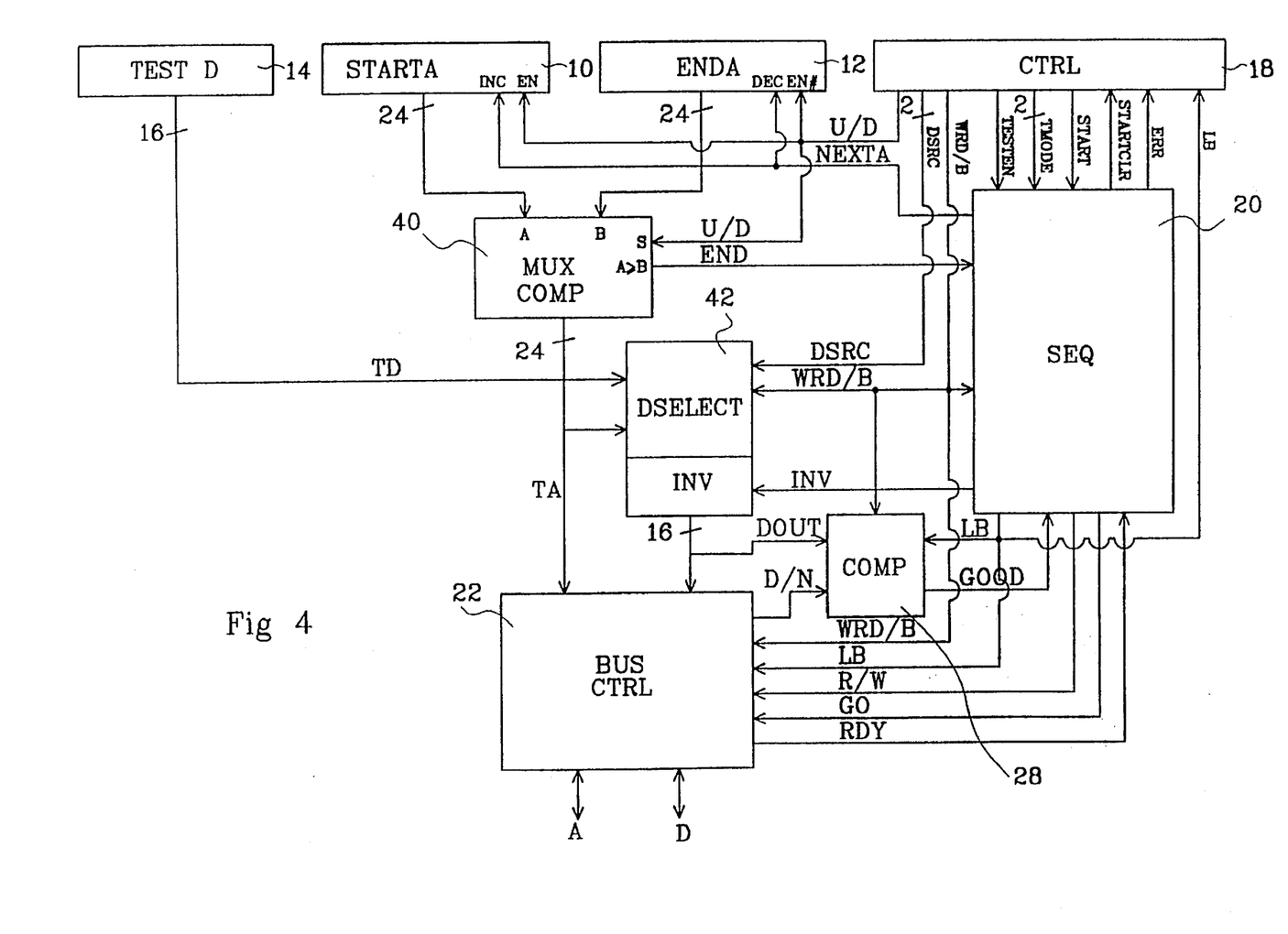
FIG. 4 schematically represents an embodiment of a more sophisticated test circuit according to the invention.

FIG. 4 represents a more sophisticated embodiment of the test circuit according to the invention allowing to further optimization of a large number of known test methods.

In FIG. 4, elements corresponding to those in FIG. 2 are designated by the same references. Comparator 26 of FIG. 2 is replaced by a comparison and multiplexing circuit 40. Circuit 40, like comparator 26, provides a signal END to sequencer 20 when the contents (STARTA and ENDA) of registers 10 and 12 are equal. Additionally, depending on the state of a line U/D corresponding to a bit of the control register 18, circuit 40 provides to the input address lines TA of the interface circuit 22 one or other of the addresses contained in registers 10 and 12.

Line U/D enables the counting mode of register 10 when in state "1", for example, and the counting mode of register 12 when in state "0". Line NEXTA from sequencer 20 feeds an increment input INC of register 10 and a decrement input DEC of register 12. When line U/D is at "1", circuit 40 provides address STARTA (register 10) to the interface circuit 22, and address ENDA (register 12) if line U/D is at "0".

With this configuration, it is possible, depending on the state of line U/D, to scan a block to be tested by addresses increasing from the start address or by addresses decreasing from the end address.

A selection circuit 42 receives on lines TD the datum TESTD of register 14, address TA provided by circuit 40 and two selection lines DSRC whose states are set by two bits of register 18. In dependence on the values defined by lines DSRC, circuit 42 causes the interface circuit 22 to be fed with a test datum corresponding either to the datum TESTD of register 14, or to one of three combinations of the address bits of address TA provided by circuit 40. Additionally, the test datum DOUT provided by the selection circuit 42 can be complemented or not depending on the state of a signal INV provided by sequencer 20.

In some test methods, it is useful to write different test data in the cells to be tested. With the configuration described above, it is possible to write in each cell to be tested a selected portion of the cell address; this is a simple way to write different values in the cells.

The circuit of FIG. 4 is also capable of executing tests on portions of each memory cell, for example on the 8 least significant bits or on the 8 most significant bits. A bit WRD/B of the control register 18 is used to indicate whether the test is to be carried out with 16 or 8 bits of the memory cells. The state of bit WRD/B is provided to sequencer 20, selection circuit 42, interface circuit 22, and comparator 28. Comparator 28 compares the test datum DOUT provided by the selection circuit 42 with the datum DIN read on the bus. A line LB, whose state is set by the sequencer 20, is connected to comparator 28 and the interface circuit 22, and sets the state of a bit LB of the control register 18. When line WRD/B indicates that a test is to be carried out with 8 bits of the memory cells, the state of line LB indicates whether the test is to be carried out with the most significant byte or the least significant byte of the memory cells to be tested.

The following table sums up preferred values of the test datum DOUT provided by the selection circuit 42 as a function of the four possible values defined by lines DSRC and of the states of line WRD/B.

| DSRC | WRD/B | DOUT |
| --- | --- | --- |
| Val 1 | 1 | TESTD(15:0) |
|  | 0 | TESTD(7:0), TESTD(7:0) |
| Val 2 | 1 | TA(15:0) |
|  | 0 | TA(7:0), TA(7:0) |
| Val 3 | X | TA(23:16), TA(23:16) |
| Val 4 | X | TA(15:8), TA(15:8) |

The first column of the table lists the four possible values of variable DSRC. These values are generically designated by Val 1 to Val 4. Those skilled in the art will be able to choose for these values suitable state combinations of lines DSRC. The second column indicates, for each value of variable DSRC, the two states of line WRD/B. The third column indicates values DOUT provided by the selection circuit 42. An X in a column indicates a value 1 or 0, indifferently.

In the column showing the values of datum DOUT, "TESTD(15:0)", for example, indicates that datum DOUT includes the bits 0 to 15 of datum TESTD. Value "TESTD(7:0), TESTD(7:0)", for example, indicates that the least significant byte and the most significant byte of datum DOUT are equal to the bits 0 to 7 of datum TESTD. If line INV is asserted, datum DOUT has the complementary values to those of the table.

The operation of the elements of the test circuit of FIG. 4 will be described in more detail with reference to the flowcharts of FIGS. 3 and 5.

The circuit of FIG. 4 functions according to the flowchart of FIG. 3 with the inclusion of the blocks represented in dotted lines in FIG. 3 (102, 106, 114, 130), as well as an additional operation in blocks 118 and 134.

Figure 5:
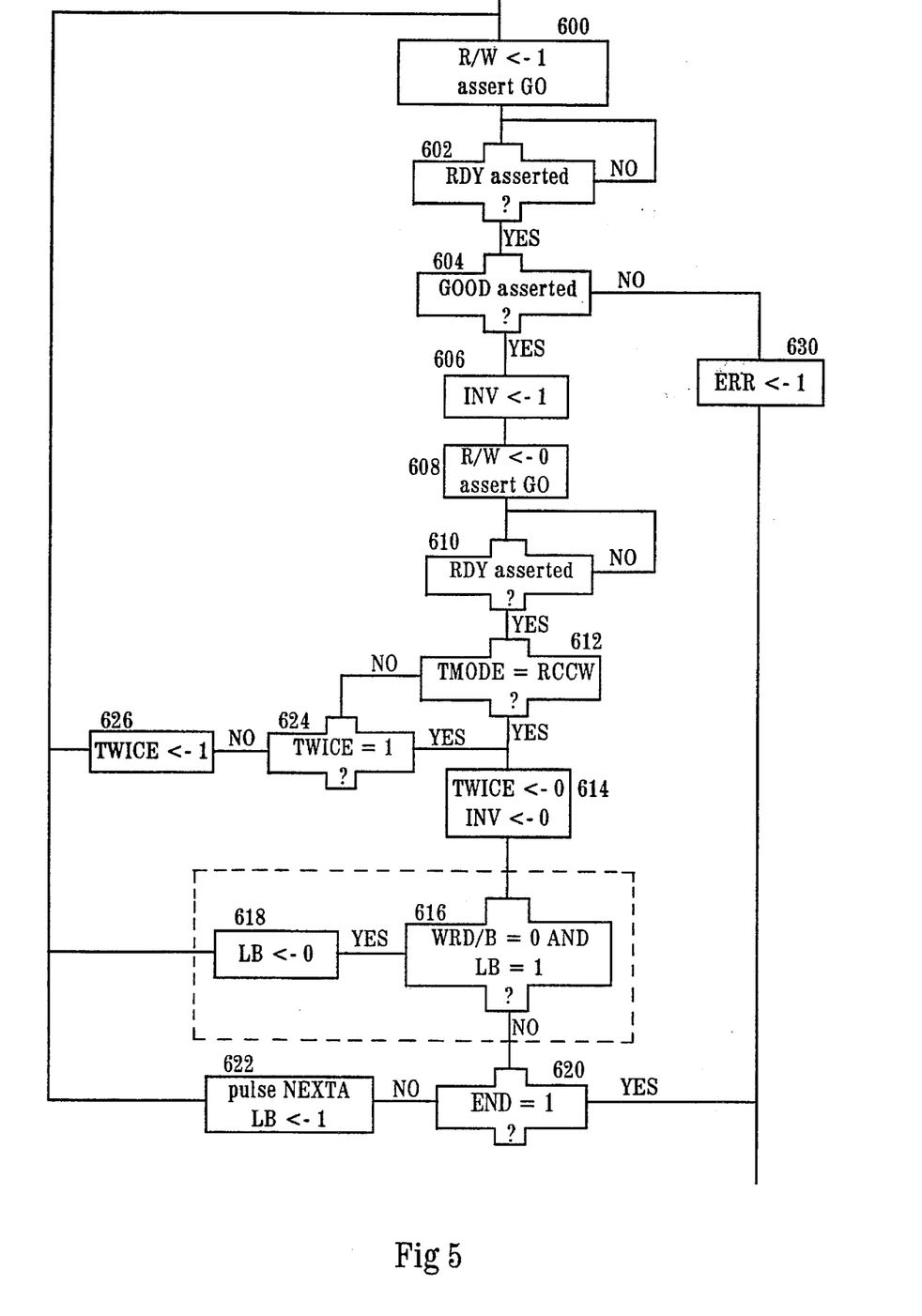
FIG. 5 is a flowchart of part of the operations executed by the sequencer of the circuit of FIG. 4.

FIG. 5 represents a flowchart of the operations executed in block 106 of the flow-chart of FIG. 3. In the following description, before describing the flow-chart of FIG. 5, the steps needed to arrive at block 106 will first be described.

100. The sequencer 20 remains in a stand-by state as long as bit START is "0".

102. The sequencer 20 disables line INV, asserts line LB and disables an internal bit "TWICE".

104. The variable TMODE is checked. Variable TMODE is, in the circuit of FIG. 4, encoded by 2 bits and defines four different values, labelled W, RC, RCCW, and RCCW2. Values W and RC respectively select a write phase and a read-comparison phase, which are described in detail in the flowchart of FIG. 3. Values RCCW and RCCW2 respectively select the "read-compare-complement-write" and "twice read-compare-complement-write" phases.

600. Variable TMODE is equal to RCCW or RCCW2. Line R/W is set to "1" and line GO is asserted. The interface circuit 22 takes control of the bus to read the datum present at address TA and to latch it on lines DIN. If line WRD/B is at "1", the datum read is presented without modification on lines DIN. If line WRD/B is at "0", two cases are possible:

if line LB is at "1", which is the case when block 600 is entered for the first time, the least significant byte of the read datum is presented on lines DIN; and if line LB is at "0", the most significant byte is presented on lines DIN.

602. Sequencer 20 waits for the assertion of line RDY by the interface circuit 22, to signal that reading is completed. Comparator 28, also taking into account the states of lines WRD/B and LB, compares datum DIN with the test datum DOUT. If both data are equal, comparator 28 asserts line GOOD.

604. A check is made as to whether line GOOD is asserted.

606. Line GOOD is asserted, which means that no abnormal condition has been detected in the tested cell. Line INV is set to "1", which causes the datum DOUT to be complemented.

608. Line R/W is set to "0", and line GO is asserted. The interface circuit 22 takes control of the bus and writes at address TA the complemented datum DOUT. If line WRD/B is at "1", the interface circuit 22 writes on the bus the full datum DOUT. If line WRD/B is at "0", two cases are possible:

if line LB is at "1", which is the case when block 608 is entered for the first time, the interface circuit 22 writes on the bus the least significant byte of the complemented datum DOUT; and if line LB is at "0", the interface circuit 22 writes the most significant byte of the complemented datum DOUT.

610. The sequencer 20 waits for the assertion of line RDY signalling that the write phase is completed.

612. A check is made as to whether variable TMODE is equal to RCCW. In blocks 600–610, one "read-compare-complement-write" operation has just been executed.

614. Variable TMODE is equal to RCCW. Variable TWICE is set to "0" (this variable is used for a "twice read-compare-complement-write" operation to check whether the operation is completed or whether the second read-compare-complement-write " pass has still to be carried out). Line INV is disabled.

616. A check is made as to whether line WRD/B is at "0" and whether line LB is at "1". This is to know whether a full or partial memory cell is being tested (for example, one byte out of the 16 bits of the cell). In the case of a partial test, the least significant byte is tested in one pass, and the most significant byte is tested in another pass.

618. The condition of block 616 is true. This means that a partial test of a cell is being executed and that the least significant byte has just been tested. Line LB is set to "0" and the test phase is resumed at block 600 in order to test the most significant byte.

Blocks 616 and 618, surrounded by a dotted box, correspond identically to each of blocks 114 and 130 of the flowchart of FIG. 3. The flowchart of FIG. 3, with the inclusion, for a write phase (W) of block 114 and for a read-comparison phase (RC) of block 130, applies to the circuit of FIG. 4 when carrying out a partial test of the memory cells.

620. The condition of block 616 is false. The test of the cell is completed. Sequencer 20 checks whether line END is asserted. If yes, addresses STARTA and ENDA contained in registers 10 and 12 are equal and the block has been tested without detecting an abnormal condition. Bit START of register 18 is set to "0" at block 120 and the test phase is suspended.

622. Line END is not asserted. Cells remain to be tested. Sequencer 20 pulses line NEXTA which causes, depending on the state of line U/D, the incrementating of address STARTA or the decrementating of address ENDA. (Circuit 40 provides the interface circuit 22 with the address which is to be incremented or decremented). Line LB is set to "1" and the test phase is resumed at block 600. Here, the setting to "1" of line LB serves only in the case of a partial test phase, to re-establish the initial state of line LB modified at block 618.

Blocks 118 and 134 of the flowchart of FIG. 3 are completed by a setting operation of line LB, and are therefore identical to block 622.

624. Variable TMODE is not equal to RCCW (but is equal to RCCW2). A "twice read-compare-complement-write" phase is executed. A check is made whether variable TWICE is "1". If yes, a "twice read-compare-complement-write" operation is completed and the phase continues at block 614.

626. Variable TWICE is at "0", which means that a single pass of the "twice read-compare-complement-write" operation has been executed. Variable TWICE is set to "1" and the phase continues at block 600 to execute the second pass.

630. Line GOOD is not asserted after a read operation. An abnormal condition is detected; bit ERR is set to "1" and the test phase is suspended by the disabling of bit START at block 120. Line LB, which determines the state of a bit LB of register 18, makes it possible to indicate, when operating in partial test mode (line WRD/B at "0"), whether the abnormal condition occurred in the least significant byte or in the most significant byte of the tested cell.

The test circuit or FIG. 4 can be advantageously used for most of the conventional test methods. The repetitive tasks that had to be executed with a program can all be achieved by the DMA/test circuit according to the invention. The test program merely has to "program" these repetitive tasks in registers 10, 12, 14, and 18, and to conventionally store the results of the test. The repetitive tasks are assigned to a hard wired circuit that executes them much more rapidly than a program.

A major advantage of the DMA/test circuit according to the invention is that it can replace the DMA controller present in existing microprocessor boards, provided that the ROM containing the instructions of the test program is also replaced.

The invention has been described by using common examples ( 16-line data bus, partial test on 8 least significant bits and 8 most significant bits . . . ). Of course, the invention applies to other situations (32-line bus, partial test on an arbitrary number of bits . . . ).

As is apparent to those skilled in the art, various modifications can be made to the above disclosed embodiments. In particular, there are many different flowcharts for achieving the described functions With the described flowcharts, those skilled in the art will be able to easily write in a high level language, such as VHDL, a functional description serving to program a logic circuit, such as PAL, GAL or other circuits.

We claim:

1. A direct memory access (DMA) controller for use in a microprocessor-based system for enabling a microprocessor of the system to set up DMA transfers between a memory of the system and other elements of the system, the DMA controller comprising register means coupled with the microprocessor so the microprocessor can write data into the register means for setting up said transfers;

means for controlling the register means so that:
(a) in a first mode the microprocessor sets up normal DMA transfers in the register means, and
(b) in a second mode the microprocessor activates the register means to perform a read-after-write test on a block of addresses in said memory specified by the data the microprocessor writes into said register means, said read-after-write test resulting in (i) test data being written into addresses of said block of addresses and (ii) reading back the contents of thus-written-into addresses, said means for controlling the register means including means for generating said test data by using for said test data address bits of addresses to be tested; and comparator means for comparing bits read back from the memory addresses in the tested block of addresses in said memory specified by data the microprocessor writes into said register means with bits stored in said register means representing the test data written into the tested block of addresses.

2. The DMA controller of claim 1 wherein said register means comprises first, second and third registers, the first and second registers being incrementable and/or decrementable and the third register storing in said second mode of the DMA controller control and status information for testing said block of memory, the DMA controller further including:

a selectively enabled interface circuit coupled with the memory block for reading or writing data on a microprocessor bus coupled with the DMA controller, said first, second and third registers being accessible from the bus via said interface circuit, test-datum means for supplying test data to said interface circuit and to said comparator means, the control means further including means, operative when the DMA controller is in the second mode, for controlling (a) writing a test datum supplied by said test datum means via said interface circuit to a specific address of said block of memory, the specific address being contained in one of said first and second registers, and (b) reading back a datum from said specific address via the interface circuit to said comparator means, the comparator means, (a) comparing the datum read back from said specific address with the test datum written into the comparator means and (b) setting an error bit of said third register in response to the read-back datum differing from the test datum in the comparator means, the control means further comprising:
means for successively incrementing or decrementing the specific address contained in said one of the first and second registers while said error bit is not set,
a comparator for deriving a phase-end signal in response to the contents of the first and second registers being equal, and
means for halting the incrementing or decrementing in response to the phase-end signal being derived and for indicating that the incrementing or decrementing has been halted by modifying one bit of the third register.

3. The DMA controller of claim 2 wherein said test-datum means comprises a fourth register, accessible from said bus via the interface circuit, for holding a datum written into the fourth register over said bus, said datum that is held in the fourth register being said test datum while the DMA controller is in the second mode.

4. The DMA controller of claim 3 wherein the fourth register holds the address bits written into the register means by the microprocessor, the fourth register being responsive to the value of a first plurality of bits of the third register to supply the address bits in the fourth register to said comparator means.

5. The DMA controller of claim 4 further including a selection means including an inverter for complementing the test datum, the inverter being selectively enabled in response to an inversion signal derived by said control means.

6. The DMA controller of claim 5 wherein said control means responds to values of bits of a second plurality of bits in the third register for testing said memory by:
(i) reading and comparing the read datum with the test data,
(ii) reading, comparing and writing the complement of the test datum, and
(iii) twice reading, comparing and writing the complement of the test datum,
(i), (ii) and (iii) being performed at different times in response to different values of the bits of the second plurality of bits of the third register.

7. The DMA controller of claim 2 wherein the control means is arranged so one bit of the third register controls which of said first and second modes to which the DMA controller is set.

8. The DMA controller of claim 2 wherein the control means is arranged so the microprocessor selectively sets one bit of the third register to start or to continue memory testing, and the control means selectively resets one bit of the third register to interrupt the microprocessor at the end of testing or when said error bit is set.

9. The DMA controller of claim 2 wherein the control means is arranged so the state of one bit of the third register controls whether the first register is selectively incremented or whether the second register is selectively decremented, the first register being incremented while the second register is decremented and the second register being incremented while the first register is decremented.

10. The DMA controller of claim 2 wherein the address bits written by the microprocessor into the register means represent an initial address to be tested, the control means including means for successively incrementing and/or decrementing the address bits written by the microprocessor into the register means so the initial address written into the register means is successively incremented and/or decremented.

11. The DMA controller of claim 10 wherein the fourth register holds the address bits written into the register means by the microprocessor, the fourth register being responsive to the value of a first plurality of bits of the third register to supply the address bits in the fourth register to said comparator means.

12. The DMA controller of claim 1 wherein the address bits written by the microprocessor into the register means represent an initial address to be tested, the control means including means for successively incrementing and/or decrementing the address bits written by the microprocessor into the register means so the initial address written into the register means is successively incremented and/or decremented.

13. A method of controlling direct memory access (DMA) in a microprocessor-based system so a microprocessor of the system sets up DMA transfers between a memory of the system and other elements of the system, the DMA control method comprising setting up said transfers by writing data from the microprocessor into a register means;

controlling the register means so that:
(a) in a first mode the microprocessor sets up normal DMA transfers in the register means, and
(b) in a second mode the microprocessor activates the register means so a read-after-write test is performed on a block of addresses in said memory specified by the data the microprocessor writes into said register means, said read-after-write test resulting in (i) test data being written into addresses of said block of addresses and (ii) reading back the contents of thus-written-into addresses, generating said test data by using r said test data address bits of addresses to be tested; and comparing bits read back from the memory tested addresses in the block with bits stored in said register means representing the test data written into the tested addresses in the block.

14. The DMA control method of claim 13 wherein said register means comprises first, second and third registers, the first and second registers being incrementable and/or decrementable, the DMA method further including:

storing status information for testing said block of memory in the third register during said second mode control, reading and writing data between the memory block and a microprocessor bus via a selectively enabled interface circuit, accessing said first, second and third registers from the bus via said interface circuit, supplying test data to said interface circuit and to a comparator means which performs the comparing step, when the DMA control is in the second mode:
(a) writing a test datum via said interface circuit to a specific address of said block of memory contained in one of said first and second registers, and (b) reading back a datum from said specific address via the interface circuit to said comparator means, the comparator means (a) comparing the datum read back from said specific address with the test datum written into the comparator means and (b) setting an error bit of said third register in response to the read-back datum differing from the test datum in the comparator means, successively incrementing or decrementing the specific address contained in one of the first and second registers while said error bit is not set, deriving a phase-end signal in response to the contents of the first and second registers being equal, halting the incrementing or decrementing in response to the phase-end signal being derived and indicating that the incrementing or decrementing has been halted by modifying a bit of the third register.

15. The DMA control method of claim 14 wherein the address bits written by the microprocessor into the register means represent an initial address to be tested, and successively incrementing and/or decrementing the address bits written by the microprocessor into the register means so the initial address written into the register means is successively incremented and/or decremented.

16. The DMA control method of claim 15 wherein the register means includes a fourth register, activating the fourth register so it (a) holds the address bits written into the register means by the microprocessor and (b) is responsive to the value of a first plurality of bits of the third register to supply the address bits in the fourth register to said comparator means.

* * * * *